(12) United States Patent
Vittal Prabhu et al.

(10) Patent No.: US 12,393,367 B2
(45) Date of Patent: Aug. 19, 2025

(54) LEAN COMMAND SEQUENCE FOR MULTI-PLANE READ OPERATIONS

(71) Applicant: Intel NDTM US LLC, Santa Clara, CA (US)

(72) Inventors: Naveen Vittal Prabhu, Folsom, CA (US); Aliasgar Madraswala, Folsom, CA (US); Sandeep Rasoori, Folsom, CA (US); Trupti Bemalkhedkar, San Jose, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 848 days.

(21) Appl. No.: 17/411,899

(22) Filed: Aug. 25, 2021

(65) Prior Publication Data

US 2023/0062668 A1 Mar. 2, 2023

(51) Int. Cl.
*G06F 3/06* (2006.01)
(52) U.S. Cl.
CPC .......... *G06F 3/0659* (2013.01); *G06F 3/0611* (2013.01); *G06F 3/0644* (2013.01); *G06F 3/0679* (2013.01)
(58) Field of Classification Search
CPC ......... G06F 12/0246; G06F 2212/1004; G06F 2212/1024; G06F 2212/1048; G06F 2212/7208; G06F 3/0611; G06F 3/0644; G06F 3/0659; G06F 3/0679
See application file for complete search history.

(56) References Cited

U.S. PATENT DOCUMENTS

| 2015/0254181 A1 | 9/2015 | Andre et al. |
| 2019/0188126 A1 | 6/2019 | Chun |
| 2022/0254409 A1* | 8/2022 | Desai ................. G11C 11/4093 |

OTHER PUBLICATIONS

European Search Report for EP application 22185357.5, dated Dec. 14, 2022, 11 pages.

* cited by examiner

*Primary Examiner* — Yong J Choe
(74) *Attorney, Agent, or Firm* — Morgan, Lewis & Bockius LLP

(57) ABSTRACT

Systems, apparatuses and methods may provide for technology that generates address information for a plurality of planes in NAND memory, excludes column information from the address information, and sends a read command sequence to the NAND memory, wherein the read command sequence includes the address information. In one example, the technology also excludes plane confirm commands and busy cycles from the read command sequence.

16 Claims, 4 Drawing Sheets

30

| Operation | Command Sequence |
|---|---|
| Multi Plane Super Lean Read sequence | [CMDE+4Addr(P0)] - [CMDE+4Addr(P1)] - [CMDE+4Addr(P2)] - [CMDE+4Addr(P3)+CMD2] |
| Super Lean Read - Read out Sequence (Same as Lean read - readout) | CMD3+1addr(Pl/Lun)+CMD4+2addr(col)+CMDF |
| Super Lean Read + Addr Cycle read offset | CMDE+4addr+1virtual addr + [CMDE/CMD2/CMDH] |
| Super Lean Read + Cache Seq | CMDE+4addr+ [CMDE/CMD2] + CMDH... + CMDG |
| Super Lean Read + Cache Non Seq | CMDE+4addr+[CMDE/CMD2] +.... + [CMDE/CMDH]... + CMDG |
| OTF SLC Super Lean Read | CMDD + CMDE +4addr + [CMDE/CMD2] |
| OTF SLC Super Lean Read + Cache Seq (Auto exit disabled only) | CMDD + CMDE+4addr+[CMDE/CMD2] + CMDH... + CMDG |
| OTF SLC Super Lean Read + Cache Non Seq (Auto exit disabled only) | CMDD + CMDE+4addr+[CMDE/CMD2] +.... + CMDG |

| Operation | Lean Read/Super Lean Read compatibility |
|---|---|
| Corrective Read | Yes |
| MRR via MLBi | Yes |
| ACR | Yes |
| Read Retry (Fn 8Bh) | Yes |
| ARC Persist offset | Yes |

FIG. 3B

//www.w3.org/2000/svg" viewBox="0 0 100 100">

LEAN COMMAND SEQUENCE FOR MULTI-PLANE READ OPERATIONS

TECHNICAL FIELD

Embodiments generally relate to memory structures. More particularly, embodiments relate to a lean command sequence for multi-plane read operations in memory structures.

BACKGROUND

NAND-type flash memory ("NAND memory") may be organized into multiple cells, with each cell containing one or more bits of data and being accessible through an array of bit lines (columns) and word lines (rows). Additionally, the NAND memory cells may be distributed across multiple dies, with each die containing multiple planes that are independently accessible. Reading data from multiple planes typically involves issuing a command sequence to the NAND memory, wherein the command sequence includes several "dummy" busy cycles (e.g., associated with plane confirm commands) and the command sequence identifies the columns being accessed. The time taken for the dummy busy cycles and transmission of the column data may increase latencies and have a negative impact on performance.

BRIEF DESCRIPTION OF THE DRAWINGS

The various advantages of the embodiments will become apparent to one skilled in the art by reading the following specification and appended claims, and by referencing the following drawings, in which:

FIG. 3A is an illustration of an example of a table of other applicable scenarios according to embodiments;

FIG. 3B is an illustration of an example of a capability chart for read recovery features according to embodiments.

DESCRIPTION OF EMBODIMENTS

As input/output (IO) speeds in NAND memory devices increase from generation-to-generation, command overhead may not scale accordingly. Indeed, command and address cycles can add significant overhead at higher IO speeds. Embodiments provide for a "super lean" read command sequence that improves channel efficiency for sequential read operations by eliminating any need for column address cycles, multi-plane confirm commands and multiple dummy busy cycles (e.g., tDBSY, which each may consume on the order of 1 microseconds/µs. Embodiments are also extendable to program operation command protocols.

More particularly, a NAND memory may assume that a fixed amount of data (e.g., 16 KB) is being read per plane. In addition, NAND provides capability to remove multi-plane confirm commands, thus eliminating associated latency (tDBSY). Furthermore, the readout operation (data transfer from NAND buffer to host) is also optimized. The read command sequence described herein may be considered "super lean" because the sequence provides the fastest command protocol to enable multi-plane/single plane read operations.

Figure 1:
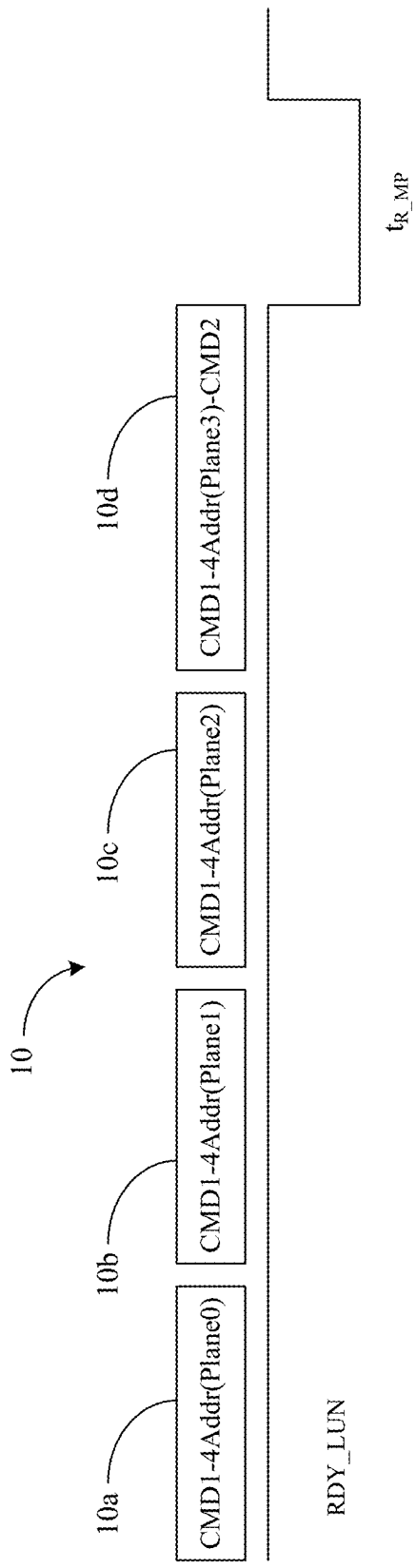
FIG. 1 is a signaling diagram of an example of a read command sequence according to an embodiment.

Turning now to FIG. 1, a multi-plane enhanced read command sequence 10 (10a-10d) is shown. In an embodiment, the enhanced read command sequence 10 is conducted by a memory chip controller apparatus when a die/logical unit number (LUN) ready signal (RDY_LUN) in NAND memory is high. For example, a first sequence component 10a triggers a read from a first plane, a second sequence component 10b triggers a read from a second plane, a third sequence component 10c triggers a read from a third plane, and a fourth sequence component 10d triggers a read from a fourth plane. Although four planes are shown in the illustrated example for the purposes of discussion, the read command sequence can be readily expanded to any number of planes.

The read command sequence 10 includes a plurality of first commands ("CMD1") that signal reads from one of the plurality of planes, address information ("4Addr" or four addresses) for each of a plurality of planes in NAND memory, and a second command ("CMD2") that signals the end of the read command sequence 10. In an embodiment, the address information identifies rows in terms of a die, a plane, a block, and a page the NAND memory. Of particular note is that the address information does not include column addresses. Rather, the read command sequence 10 uses a fixed number of columns (e.g., 16 KB). For example, the NAND memory may internally force the column address to "0" and enable a 16K page read.

By contrast, a conventional quad plane (QP) read command sequence might be:

CMDA-6addr-CMDB-(tDBSY)-CMDA-6addr-CMDB-(tDBSY)-CMDA-6addr-CMDB-(tDBSY)-CMDA-6addr-CMD2

Where the command "CMDA" signals the beginning of each conventional plane access, "6addr" identifies the columns and the rows being accessed, the command "CMDB" is a plane confirm command (e.g., instructing the NAND memory to wait until the sequence is complete before returning the requested data), tDBSY is a dummy busy cycle, and the "CMD2" signals the end of the read command sequence. Thus, the enhanced read command sequence 10 eliminates eight address latch enable (ALE) cycles (e.g., corresponding to the eight column addresses), three commands (e.g., corresponding to the plane confirm commands) and three dummy busy cycles.

Once the second command CMD2 is issued, the controller may wait for a multi-plane read time ($t_{R\_MP}$) before issuing a multi-plane readout command sequence. In an embodiment, the readout command sequence is:

CMD3-1addr (P1: 5:4, LUN: 2:0)+CMD4-2addr(Col)-CMD5

Thus, a third command "CMD3" is accompanied by a plane address (e.g., bits 5:4) and a die address (e.g., bits 2:0), a fourth command "CMD4" is accompanied by a plurality of column addresses ("2addr"), and a fifth command "CMD5" signals the end of the enhanced readout command sequence.

By contrast, a conventional readout command sequence might be:

CMDC-6addr-CMD5 per plane

Where the command "CMDC" signals the start of the conventional readout command sequence, "6addr" identifies the columns and the rows being accessed, and the fifth command "CMD5" signals the end of the conventional readout command sequence.

Thus, the enhanced readout command sequence eliminates eight ALE cycles (e.g., corresponding to the eight column addresses). The combined impact saves 3.3 µs for a QP read operation and provides substantial improvements in command latency for read operations. Indeed, the command protocol optimization scales with the number of planes to be read.

Figure 2:
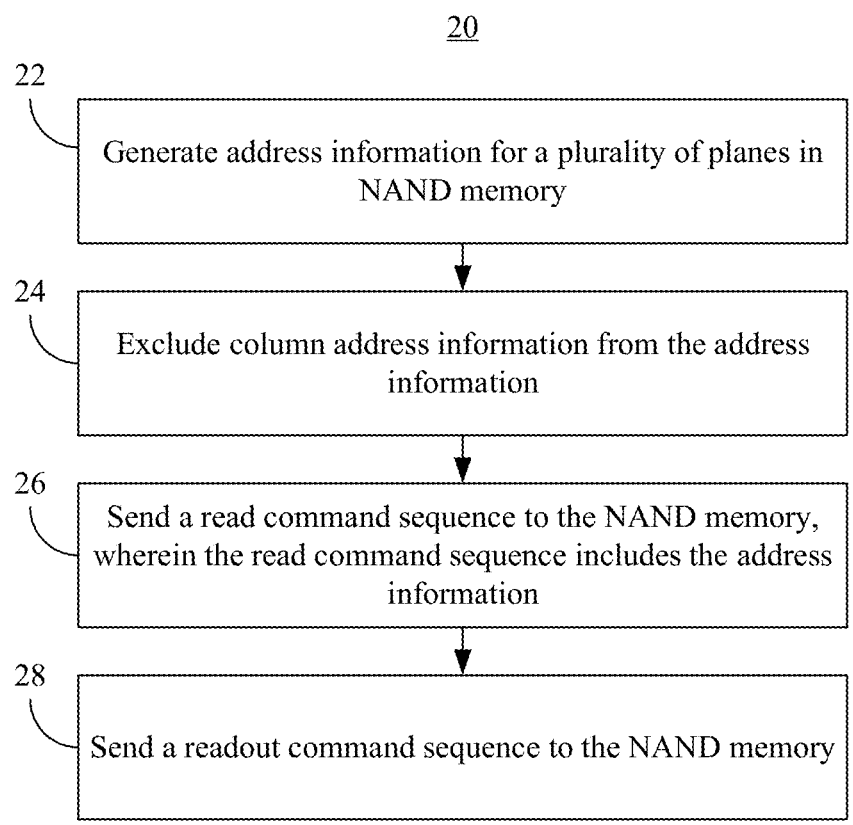
FIG. 2 is a flowchart of an example of a method of operating a performance-enhanced controller according to an embodiment.

FIG. 2 shows a method 20 of operating a performance-enhanced controller. The method 20 may be implemented in one or more modules as a set of logic instructions stored in a machine- or computer-readable storage medium such as random access memory (RAM), read only memory (ROM), programmable ROM (PROM), firmware, flash memory, etc., in configurable hardware such as, for example, programmable logic arrays (PLAs), field programmable gate arrays (FPGAs), complex programmable logic devices (CPLDs), in fixed-functionality hardware using circuit technology such as, for example, application specific integrated circuit (ASIC), complementary metal oxide semiconductor (CMOS) or transistor-transistor logic (TTL) technology, or any combination thereof.

Illustrated processing block 22 generates address information for a plurality of planes in NAND memory, wherein block 24 excludes column address information from the address information. Additionally, block 26 sends a read command sequence to the NAND memory, wherein the read command sequence includes the address information. In an embodiment, block 26 excludes plane confirm commands and busy cycles from the read command sequence. As already noted, the read command sequence may include a plurality of first commands (e.g., CMD1) with row addresses corresponding to each of the plurality of planes, wherein each first command signals a read from one of the plurality of planes. In one example, the read command sequence further includes a second command (e.g., CMD2), wherein the second command signals an end of the read command sequence. Moreover, each row address may identify a page, a plane, a block, and a die in the NAND memory.

The controller may use a read status enhanced procedure to track the status of the read operation, wherein block 28 sends (e.g., when a die/LUN ready signal is high) a readout command sequence to the NAND memory. In an embodiment, the readout command sequence includes a third command (e.g., CMD3) with a plane and die address, a fourth command (e.g., CMD4) with a plurality of column addresses, and a fifth command (e.g., CMD5). The fifth command signals the end of the readout command sequence. The method 20 therefore enhances performance at least to the extent that excluding column address information, plane confirm commands and/or busy cycles from the read command sequence speeds up read operations. Performance is further enhanced by eliminating ALE cycles from the readout command sequence.

Super lean read as described herein is also applicable with on the fly (OTF) single level cell (SLC) operations using a prefix opcode (e.g., "CMDD") technology:
CMDD+CMDE-4Addr-CMDB/CMD2.

FIG. 3A shows a table 30 of other applicable scenarios and FIG. 3B shows a capability chart 32 for read recovery features. In the illustrated example, embodiments may be used for corrective read, moving read reference (MRR) via multi-level bit (MLBi), address cycle read (ACR) offset, read retry feature (Ftr), auto read calibration (ARC, e.g., multiple reads at specific levels) persist offset, and so forth. For example, the corrective read function is used to read out correct data where a normal read operation did not provide the expected data within error correction code (ECC) limits. The corrective read function not only reads the wordline (WLn) for the page(s) being read but in addition reads the WLn+1. This extra read is done to check the programmed levels and comprehend the floating gate interference of the next WL. Speeding up read operations via the technology described herein may therefore substantially improve read recovery features.

Figure 4:
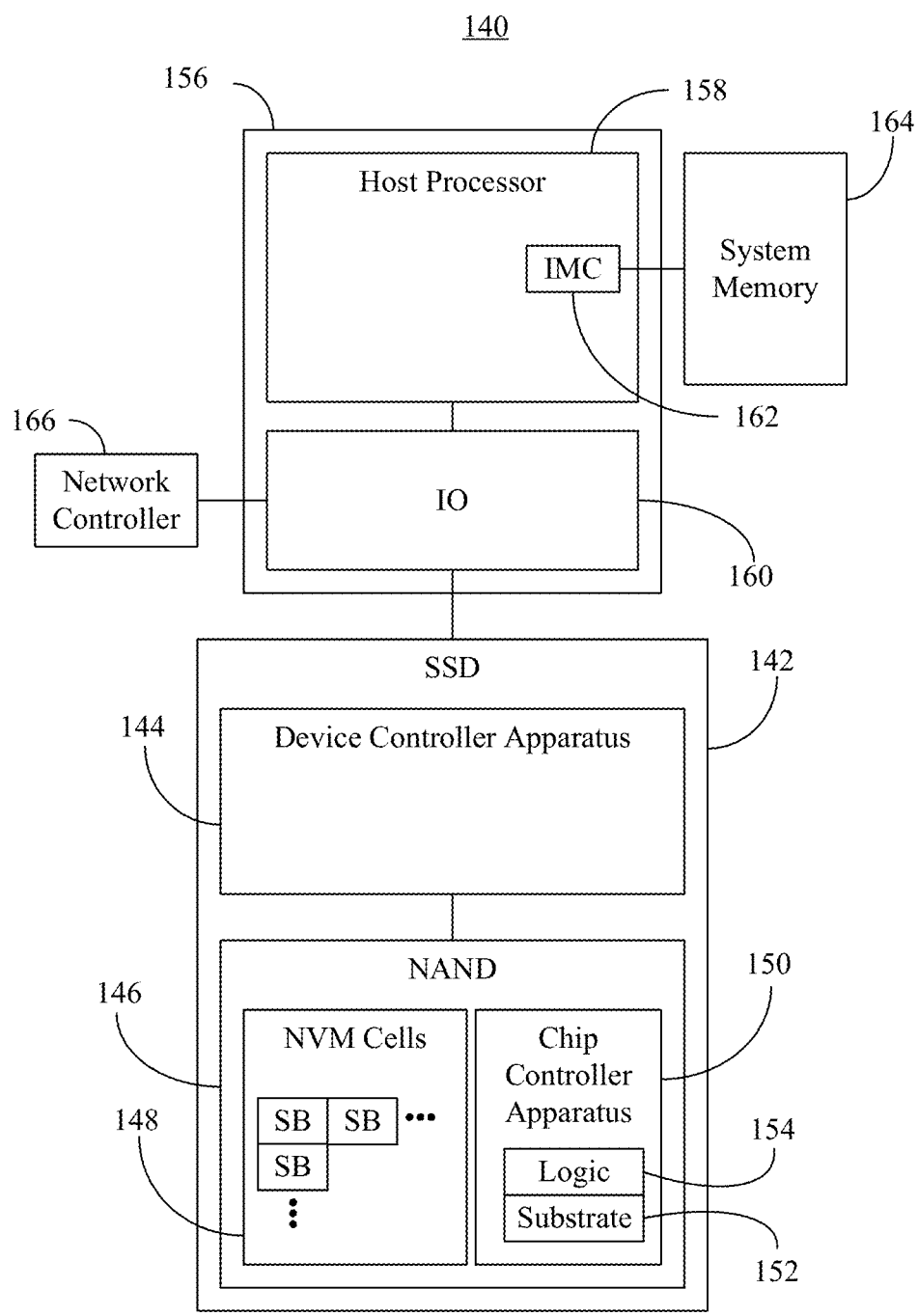
FIG. 4 is a block diagram of an example of a performance-enhanced computing system according to an embodiment.

Turning now to FIG. 4, a performance-enhanced computing system 140 is shown. In the illustrated example, a solid state drive (SSD, e.g., memory device) 142 includes a device controller apparatus 144 that is coupled to a NAND memory 146. The illustrated NAND memory 146 includes a set of NVM cells 148 (e.g., having a plurality of NAND sub-blocks/SBs) and a chip controller apparatus 150 that includes a substrate 152 (e.g., silicon, sapphire, gallium arsenide) and logic 154 (e.g., transistor array and other integrated circuit/IC components) coupled to the substrate 152. The logic 154, which includes at least partly one or more of configurable or fixed-functionality hardware, is configured to perform one or more aspects of the method 20 (FIG. 2), already discussed.

Thus, the logic 154 generates address information for a plurality planes in the NAND memory 146 and excludes all column addresses from the address information. The logic 154 also sends a read command sequence to the NAND memory 146, wherein the read command sequence includes the address information. In an embodiment, the logic 154 also excludes plane confirm commands and busy cycles from the read command sequence. The SSD 142 and/or the computing system 140 are therefore considered performance-enhanced at least to the extent that excluding column address information, plane confirm commands and/or busy cycles from the read command sequence speeds up read operations. Performance is further enhanced by eliminating ALE cycles from a readout command sequence.

The illustrated system 140 also includes a system on chip (SoC) 156 having a host processor 158 (e.g., central processing unit/CPU) and an input/output (IO) module 160. The host processor 158 may include an integrated memory controller 162 (IMC) that communicates with system memory 164 (e.g., RAM dual inline memory modules/DIMMs). The illustrated IO module 160 is coupled to the SSD 142 as well as other system components such as a network controller 166.

In one example, the logic 154 includes transistor channel regions that are positioned (e.g., embedded) within the substrate 152. Thus, the interface between the logic 154 and the substrate 152 may not be an abrupt junction. The logic 154 may also be considered to include an epitaxial layer that is grown on an initial wafer of the substrate 152.

Additional Notes and Examples

Example 1 includes a semiconductor apparatus comprising one or more substrates and logic coupled to the one or more substrates, wherein the logic is implemented at least partly in one or more of configurable or fixed-functionality hardware, the logic to generate address information for a plurality of planes in NAND memory, exclude column addresses from the address information, and send a read command sequence to the NAND memory, wherein the read command sequence includes the address information.

Example 2 includes the semiconductor apparatus of Example 1, wherein the logic is to exclude plane confirm commands and busy cycles from the read command sequence.

Example 3 includes the semiconductor apparatus of Example 1, wherein the read command sequence is to include a plurality of first commands with row addresses corresponding to each of the plurality of planes, and wherein each first command is to signal a read from one of the plurality of planes.

Example 4 includes the semiconductor apparatus of Example 3, wherein the read command sequence is to further include a second command, and wherein the second command is to signal an end of the read command sequence.

Example 5 includes the semiconductor apparatus of Example 3, wherein each row address is to identify a page, a plane, a block and a die in the NAND memory.

Example 6 includes the semiconductor apparatus of any one of Examples 1 to 5, wherein the logic is to send a readout command sequence to the NAND memory, wherein the readout command sequence is to include a third command with a plane and die address, a fourth command with a plurality of column addresses, and a fifth command, and wherein the fifth command is to signal an end of the readout command sequence.

Example 7 includes a performance-enhanced memory device comprising a NAND memory, and a controller coupled to the NAND memory, wherein the controller includes logic coupled to one or more substrates, the logic to generate address information for a plurality of planes in the NAND memory, exclude column addresses from the address information, and send a read command sequence to the NAND memory, wherein the read command sequence includes the address information.

Example 8 includes the memory device of Example 7, wherein the logic is to exclude plane confirm commands and busy cycles from the read command sequence.

Example 9 includes the memory device of Example 7, wherein the read command sequence is to include a plurality of first commands with row addresses corresponding to each of the plurality of planes, and wherein each first command is to signal a read from one of the plurality of planes.

Example 10 includes the memory device of Example 9, wherein the read command sequence is to further include a second command, wherein the second command is to signal an end of the read command sequence.

Example 11 includes the memory device of Example 9, wherein each row address is to identify a page, a plane, a block and a die in the NAND memory.

Example 12 includes the memory device of any one of Examples 7 to 11, wherein the logic is to send a readout command sequence to the NAND memory, wherein the readout command sequence is to include a third command with a plane and die address, a fourth command with a plurality of column addresses, and a fifth command, and wherein the fifth command is to signal an end of the readout command sequence.

Example 13 includes at least one computer readable storage medium comprising a set of instructions, which when executed by a controller, cause the controller to generate address information for a plurality of planes in NAND memory, exclude column addresses from the address information, and send a read command sequence to the NAND memory, wherein the read command sequence includes the address information.

Example 14 includes the at least one computer readable storage medium of Example 13, wherein the instructions, when executed, further cause the controller to exclude plane confirm commands and busy cycles from the read command sequence.

Example 15 includes the at least one computer readable storage medium of Example 13, wherein the read command sequence is to include a plurality of first commands with row addresses corresponding to each of the plurality of planes, and wherein each first command is to signal a read from one of the plurality of planes.

Example 16 includes the at least one computer readable storage medium of Example 15, wherein the read command sequence is to further include a second command, and wherein the second command is to signal an end of the read command sequence.

Example 17 includes the at least one computer readable storage medium of Example 15, wherein each row address is to identify a page, a plane, a block and a die in the NAND memory.

Example 18 includes the at least one computer readable storage medium of any one of Examples 13 to 17, wherein the instructions, when executed, further cause the controller to send a readout command sequence to the NAND memory, wherein the readout command sequence is to include a third command with a plane and die address, a fourth command with a plurality of column addresses, and a fifth command, and wherein the fifth command is to signal an end of the readout command sequence.

Example 19 includes a method of operating a controller, the method comprising generating address information for a plurality of planes in NAND memory, excluding column addresses from the address information, and sending a read command sequence to the NAND memory, wherein the read command sequence includes the address information.

Example 20 includes the method of Example 20, further including excluding plane confirm commands and busy cycles from the read command sequence.

Example 21 includes means for performing the method of any one of Examples 19 to 20.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus comprising:
one or more substrates; and
logic coupled the one or more substrates, wherein the logic is implemented at least partly in one or more of configurable or fixed-functionality hardware, the logic to:
generate address information for a plurality of planes in NAND memory;
exclude column addresses from the address information;
send a read command sequence to the NAND memory, wherein the read command sequence includes the address information; and
exclude plane confirm commands and busy cycles from the read command sequence.

2. The semiconductor apparatus of claim 1, wherein the read command sequence is to include a plurality of first commands with row addresses corresponding to each of the plurality of planes, and wherein each first command is to signal a read from one of the plurality of planes.

3. The semiconductor apparatus of claim 2, wherein the read command sequence is to further include a second command, and wherein the second command is to signal an end of the read command sequence.

4. The semiconductor apparatus of claim 2, wherein each row address is to identify a page, a plane, a block and a die in the NAND memory.

5. The semiconductor apparatus of claim 1, wherein the logic is to send a readout command sequence to the NAND memory, wherein the readout command sequence is to include a third command with a plane and die address, a fourth command with a plurality of column addresses, and a fifth command, and wherein the fifth command is to signal an end of the readout command sequence.

6. A memory device comprising:
a NAND memory; and
a controller coupled to the NAND memory, wherein the controller includes logic coupled to one or more substrates, the logic to:
generate address information for a plurality of planes in the NAND memory,
exclude column addresses from the address information,
send a read command sequence to the NAND memory, wherein the read command sequence includes the address information, and
exclude plane confirm commands and busy cycles from the read command sequence.

7. The memory device of claim 6, wherein the read command sequence is to include a plurality of first commands with row addresses corresponding to each of the plurality of planes, and wherein each first command is to signal a read from one of the plurality of planes.

8. The memory device of claim 7, wherein the read command sequence is to further include a second command, wherein the second command is to signal an end of the read command sequence.

9. The memory device of claim 7, wherein each row address is to identify a page, a plane, a block and a die in the NAND memory.

10. The memory device of claim 6, wherein the logic is to send a readout command sequence to the NAND memory, wherein the readout command sequence is to include a third command with a plane and die address, a fourth command with a plurality of column addresses, and a fifth command, and wherein the fifth command is to signal an end of the readout command sequence.

11. At least one computer readable storage medium comprising a set of instructions, which when executed by a controller, cause the controller to:
generate address information for a plurality of planes in NAND memory;
exclude column addresses from the address information;
send a read command sequence to the NAND memory, wherein the read command sequence includes the address information; and
exclude plane confirm commands and busy cycles from the read command sequence.

12. The at least one computer readable storage medium of claim 11, wherein the read command sequence is to include a plurality of first commands with row addresses corresponding to each of the plurality of planes, and wherein each first command is to signal a read from one of the plurality of planes.

13. The at least one computer readable storage medium of claim 12, wherein the read command sequence is to further include a second command, and wherein the second command is to signal an end of the read command sequence.

14. The at least one computer readable storage medium of claim 12, wherein each row address is to identify a page, a plane, a block and a die in the NAND memory.

15. The at least one computer readable storage medium of claim 11, wherein the instructions, when executed, further cause the controller to send a readout command sequence to the NAND memory, wherein the readout command sequence is to include a third command with a plane and die address, a fourth command with a plurality of column addresses, and a fifth command, and wherein the fifth command is to signal an end of the readout command sequence.

16. A method comprising:
generating address information for a plurality of planes in NAND memory;

excluding column addresses from the address information;
sending a read command sequence to the NAND memory, wherein the read command sequence includes the address information; and
excluding plane confirm commands and busy cycles from the read command sequence.

* * * * *